(12) United States Patent
Kauth et al.

(10) Patent No.: US 7,412,675 B2
(45) Date of Patent: Aug. 12, 2008

(54) HIERARCHICAL FEATURE EXTRACTION FOR ELECTRICAL INTERACTION

(76) Inventors: Thomas H. Kauth, 12222 S. Oak Grove Rd., Canby, OR (US) 97013; Patrick D. Gibson, 6001 SW. Bonita Rd., Lake Oswego, OR (US) 97035; Kurt C. Hertz, 16181 NW. Joscelyn St., Beaverton, OR (US) 97006; Laurence W. Grodd, 3705 SE. Main, Portland, OR (US) 97214

(*) Notice: Subject to any disclaimer, the term of this patent is extended or adjusted under 35 U.S.C. 154(b) by 332 days.

(21) Appl. No.: 11/202,935

(22) Filed: Aug. 12, 2005

(65) Prior Publication Data

US 2006/0059443 A1  Mar. 16, 2006

Related U.S. Application Data

(62) Division of application No. 10/180,956, filed on Jun. 24, 2002, now Pat. No. 6,931,613.

(51) Int. Cl.
G06F 17/50 (2006.01)
G06F 9/45 (2006.01)

(52) U.S. Cl. .............................................. 716/5; 716/2
(58) Field of Classification Search ...................... 716/2, 716/5
See application file for complete search history.

(56) References Cited

U.S. PATENT DOCUMENTS

| 5,452,224 | A | 9/1995 | Smith et al. |
| 5,610,833 | A | 3/1997 | Chang et al. |
| 5,629,860 | A | 5/1997 | Jones et al. |
| 5,901,063 | A | 5/1999 | Chang et al. |
| 5,999,726 | A * | 12/1999 | Ho ............................... 716/11 |
| 6,099,581 | A | 8/2000 | Sakai |
| 6,175,947 | B1 | 1/2001 | Ponnapalli et al. |
| 6,230,299 | B1 | 5/2001 | McSherry et al. |
| 6,289,412 | B1 | 9/2001 | Yuan et al. |
| 6,363,516 | B1 | 3/2002 | Cano et al. |
| 6,438,729 | B1 | 8/2002 | Ho |
| 6,449,754 | B1 | 9/2002 | You et al. |
| 6,499,131 | B1 | 12/2002 | Savithri et al. |
| 6,625,611 | B1 | 9/2003 | Teig et al. |
| 6,701,492 | B2 | 3/2004 | Jaklic et al. |
| 7,124,380 | B2 * | 10/2006 | Keller et al. .................... 716/4 |
| 2002/0104063 | A1 | 8/2002 | Chang et al. |
| 2002/0112216 | A1 | 8/2002 | Keller et al. |

* cited by examiner

Primary Examiner—Jack Chiang
Assistant Examiner—Magid Y Dimyan
(74) Attorney, Agent, or Firm—Klarquist Sparkman, LLP

(57) ABSTRACT

A method of calculating electrical interactions of circuit elements in an integrated circuit layout without flattening the entire database that describes the layout. In one embodiment, a hierarchical database is analyzed and resistance and capacitance calculations made for a repeating pattern of elements are re-used at each instance of the repeated pattern and adjusted for local conditions. In another embodiment, a circuit layout is converted into a number of tiles, wherein the resistance and capacitance calculations made for the circuit elements in the center and a boundary region of the tiles are computed separately and combined. Environmental information that affects electrical interaction between circuit elements in different levels of hierarchy is calculated at a lower level of hierarchy so that such calculations do not need to be made for each placement of a repeated cell and so that not all interacting elements need to be promoted to the same hierarchy level to compute the electrical interactions.

33 Claims, 15 Drawing Sheets

HIERARCHICAL FEATURE EXTRACTION FOR ELECTRICAL INTERACTION

CROSS-REFERENCE(S) TO RELATED APPLICATION(S)

The present application is a divisional of U.S. patent application Ser. No. 10/180,956 (now U.S. Pat. No. 6,931,613), filed Jun. 24, 2002, the benefit of which is claimed under 35 U.S.C. §120.

FIELD OF THE INVENTION

The present invention relates to verification techniques for integrated circuit designs.

BACKGROUND OF THE INVENTION

In the field of semiconductor manufacturing, physical descriptions of microdevice layouts are generally represented using data formats such as GDSII. In this representation, individual circuit elements are represented by polygons, which are typically described as a sequence of vertices. The circuit elements placed in the various physical layers in the device are represented by data layers in the description. related groups of device elements on various layers can be combined in a description of a subset of the layout, often called a cell. In turn, cells can contain other, smaller cells, or be contained in larger cells. The organization of cells (each of which contain data for multiple layers) into a tree structure is often called the hierarchy of the device.

It is clear that a hierarchical representation can represent an entire layout with greater compactness than a representation with no hierarchy, also called a flat representation. Products that import layout files for verification such as Calibre® from Mentor Graphics Corporation, the assignee of the present invention, strive to retain as much of the original hierarchy as possible, and in some cases reorganize the hierarchy or create additional levels of hierarchy for additional data compactness. An efficient hierarchical database can significantly reduce the size of the file required to describe the microdevice layout.

In many instances, a circuit as designed on a computer will not perform as anticipated due to capacitances that occur between the physical microelectronic elements that comprise the circuit as well as the small but measurable resistance of these elements. To ensure that the circuit will operate properly, it is necessary to model these capacitances and resistances and to make appropriate changes to the layout prior to fabricating the device. Parasitic plate capacitances are created due to the area of a circuit element and its distance to the circuit's substrate. Parasitic fringe capacitances are those capacitances between the vertical sides of a circuit element and a substrate. Capacitances occurring between circuit elements on the same layer of the circuit are referred to as "near body" capacitances and capacitances occurring between circuit elements on different layers of the circuit are called crossover capacitances.

A conventional method of modeling these capacitors is to flatten a hierarchical database, i.e. to analyze a database that includes a complete description of every circuit element to be created in the circuit. However, such an approach can create extremely large files and therefore require a large amount of memory and computer time to analyze. In addition, because many elements of a circuit are repeated throughout a layout, computing the capacitances and resistances of the circuit elements often means that such calculations must be repeated regardless of the fact that calculations for the same element at a different location in the layout have already been performed.

Given these problems, there is a need for a system and method that reduces the time required to model the capacitances and resistance of circuit elements in an integrated circuit design.

SUMMARY OF THE INVENTION

The present invention is a method and system for extracting electrical interaction information such as capacitances and resistances of circuit elements of an integrated circuit to be modeled by a circuit analysis program.

In one embodiment of the invention a hierarchical database is analyzed, to calculate the resistance and capacitance(s) of circuit elements within a cell. If the cell is repeated in the layout, the computed resistance and capacitance(s) calculated for the cell may be re-used and adjusted for local conditions if necessary.

In another embodiment of the invention a circuit layout is converted into a number of subsets or tiles. The resistance and capacitance(s) of the elements that may interact with elements on adjacent tiles are processed separately from those circuit elements that do not interact with circuit elements in other tiles. The resistances and capacitances computed for all circuit elements of the layout are combined in a network to be modeled by a circuit analysis program.

Another aspect of the invention is a technique for calculating the electronic interactions of elements that interact with elements in more than one level of hierarchy. Measurements of the environment of a circuit element are made at a low level of hierarchy to avoid having to repeat the measurements at a higher level or promote every element that interacts with the circuit element whose electronic interactions are being determined.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENTS

Figure 1:
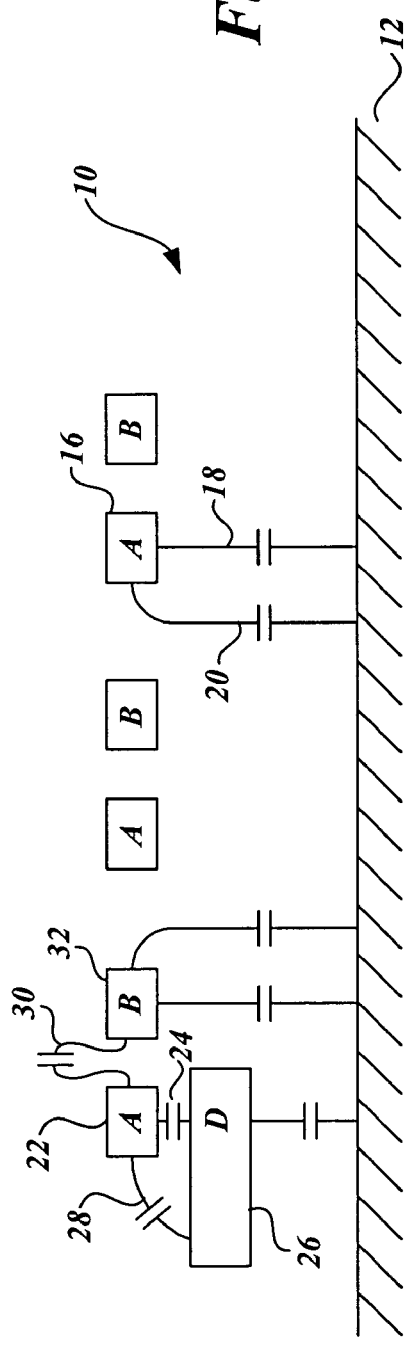
FIG. 1 schematically illustrates a portion of an integrated circuit and some of the capacitances that are formed between elements and/or a circuit substrate.

FIG. 1 is a simplified representation of a cross-section of a portion of an integrated circuit. An integrated circuit 10 includes a substrate 12 and a number of conductive circuit elements formed in layers above the substrate 12. Many of the features or elements, such as those labeled A and B are repeated in the integrated circuit. Other elements, such as that labeled D, may appear only once in the circuit layout.

As will be appreciated by those skilled in the art of circuit design and modeling, capacitances may be created between the circuit elements due to their area and the physical proximity to one another. When not blocked by an intervening element, each element in the circuit may have a plate capacitance between it and the substrate 12. For example, element 16 has a plate capacitance 18 that can be modeled as a capacitor connected between the lower surface of the element 16 and the substrate 12. In addition, the vertical edges of each element create fringe capacitances between the element and the substrate. An intrinsic fringe capacitance 20 is modeled as a capacitor connected between one edge of element 16 and the substrate 12.

In addition to the capacitances that occur between a circuit element and the substrate, the circuit elements may have crossover capacitances occurring between themselves and circuit elements on another layer of the integrated circuit. For example, an element 22 has a crossover plate capacitance 24 between itself and an element 26 located below it in the layout. In addition, a crossover fringe capacitance 28 can be modeled as a capacitor connected between the edge of the element 22 and the element 26. Finally, circuit element 22 has a near body capacitance 30 that is modeled as a capacitor connected between it and a neighboring element 32 in the same circuit layer or another circuit layer.

In order to verify the design of an integrated circuit, the electrical properties of the capacitances of the circuit elements as well as their resistances are extracted from the design and analyzed by a circuit analysis program to make changes to the layout if necessary.

Figure 2:
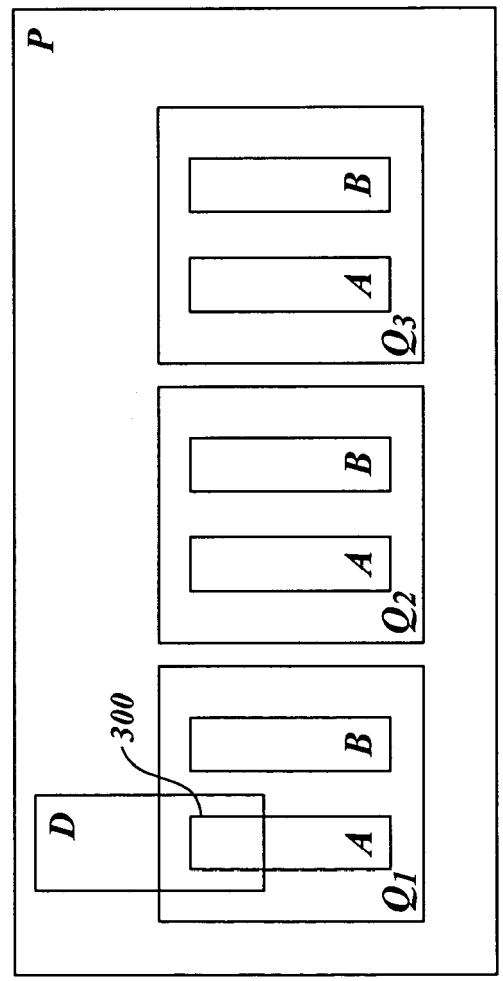
FIG. 2 is a plan view of the circuit layout of FIG. 1 and illustrates a number of repeated circuit elements or cells.

FIG. 2 illustrates how the circuit elements shown in FIG. 1 can be represented as a device layout in a computer. Each of the circuit elements A, B, and D shown in FIG. 1 is represented in a database as a polygon describing the size and location of each element.

Because some of the circuit elements in the layout are repeated (elements A and B in the present example), descriptions of these polygons need not be provided for each instance of the repeated circuit element. Rather, the database can be defined hierarchically, whereby repeated polygons need only be defined once and the database can refer to the single definition along with an indication of where the repeated polygons are placed in order to conserve memory and increase the speed of processing the database.

Figure 3:
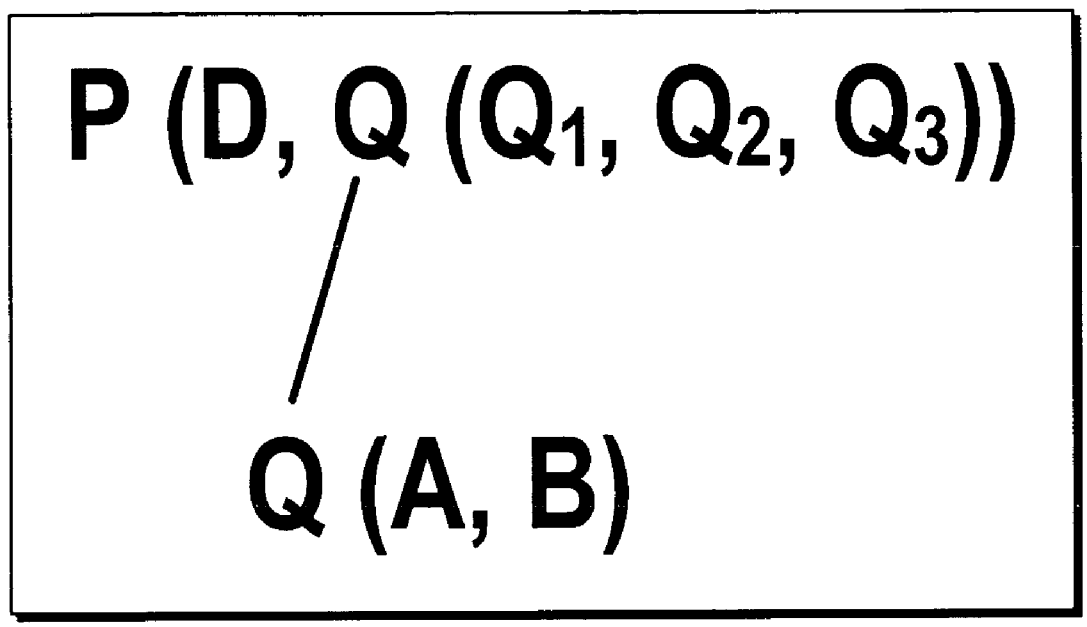
FIG. 3 illustrates how the circuit layout shown in FIG. 2 can be represented hierachically.

FIG. 3 illustrates one way in which the layout shown in FIG. 2 can be represented hierarchically in a computer system. In the example shown, a pattern of repeated elements, called a cell, need only be defined once in the database. In the example shown, a cell Q includes two polygons that represent the circuit elements A and B. Therefore, the definition for the polygons in this cell can be defined in a level Q of the database. A cell P of the database includes a circuit element D as well as three instances of cell Q (i.e., $Q_1$, $Q_2$, and $Q_3$). Therefore, the level P of the database need only include a definition of the polygon corresponding to circuit element D and a reference to cell Q as well as an indication of where the three instances of cell Q are to be placed. Cell P is referred to as a parent of cell Q because cell P references one or more instances of cell Q.

Although the database shown in FIGS. 2 and 3 only includes two cells and two levels of hierarchy, it will be appreciated that in an actual circuit layout, a database may include many hundreds of cells and levels of hierarchy in accordance with the complexity and repeated nature of the devices to be created in the integrated circuit.

FIGS. 4A-4E illustrate a series of acts performed in accordance with one implementation of the present invention in order to extract capacitances and resistances of the circuit elements in order to model the device prior to fabrication. By taking advantage of the hierarchical nature of the layout description, the number of times the capacitance and resistance calculations need to be made for each circuit element can be significantly reduced. By calculating the capacitances and resistances for a repeated circuit element, the calculations can be reused for each placement of the circuit element or used as a starting point in order to adjust for local variations occurring at each placement. Although the acts performed by this implementation of the invention as set forth below are described in a particular order for ease of explanation, it will be appreciated that the acts may be performed in other orders or that equivalent acts may be performed to achieve the desired resistance and capacitance information.

Figure 4A:
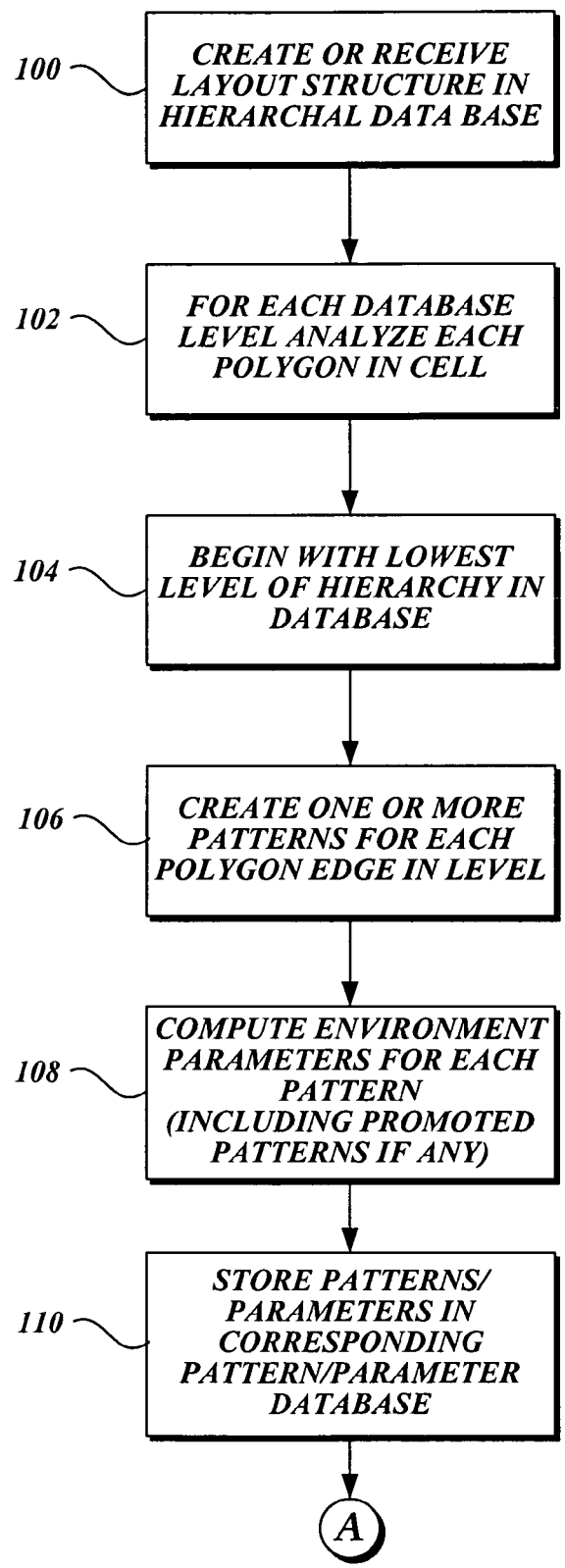
FIGS. 4A-4E are flowcharts illustrating one implementation of a capacitance and resistance extraction method in accordance with the present invention.
Figure 4B:
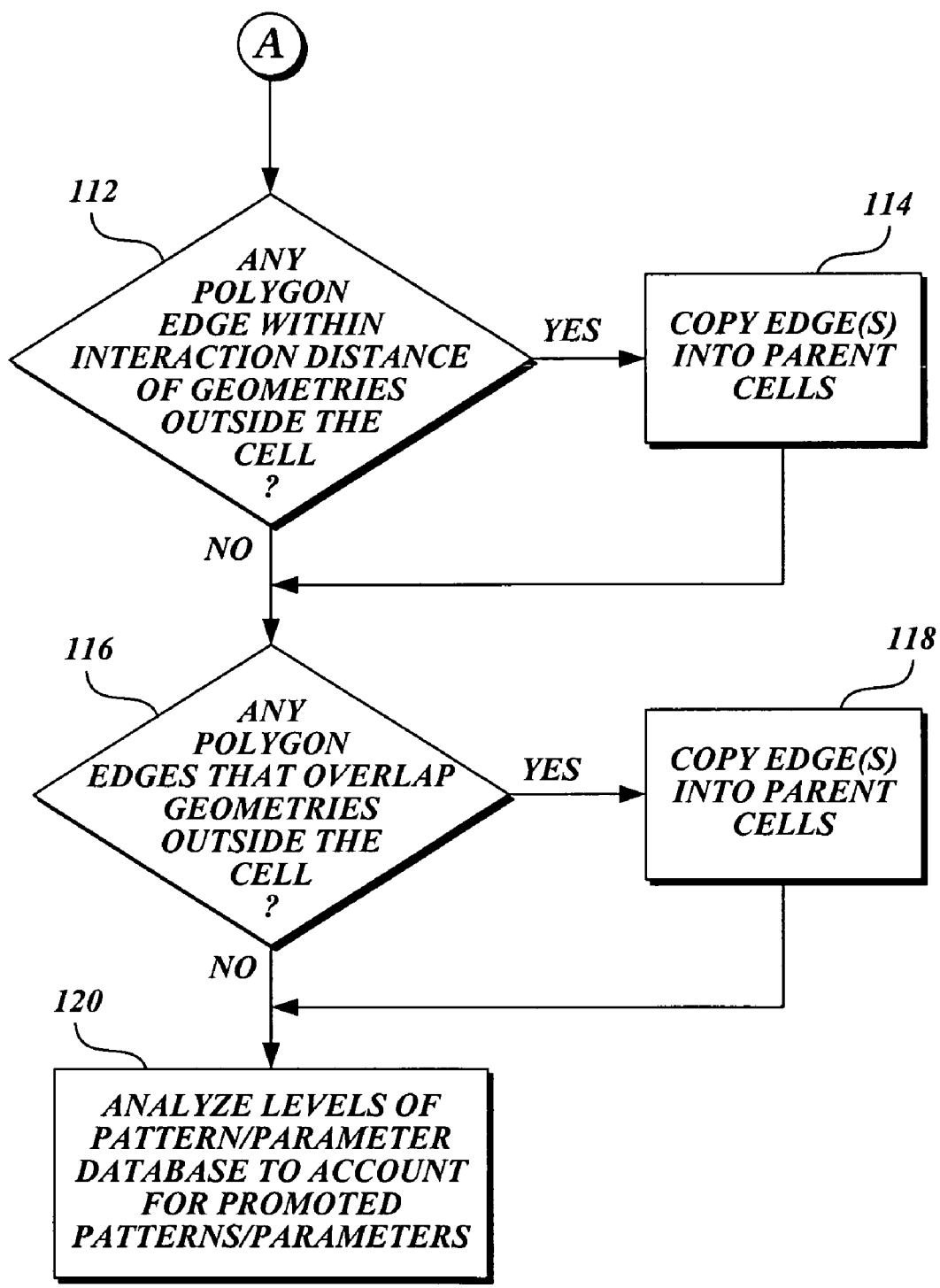

Referring now to FIG. 4A, the process of estimating or extracting the capacitances and resistances of a layout begins at a block 100, when a layout database is received or created by a computer system from a stream of GDS II data. The database defines a number of polygons, each of which represents a circuit element to be created in the device. Preferably, the database is defined in a hierarchical manner, whereby repeated patterns of polygons are defined in separate levels of the database and instances of the repeated cells are referred to indirectly rather than being redefined at each instance. If the database received is not hierarchical in nature, it is preferred that the database be arranged in a hierarchical fashion prior to calculating the resistances and capacitances in accordance with this implementation of the present invention.

At a block 102, a computer system, which may be either a stand-alone or distributed system, having one or more processors executes a sequence of programmed instructions that are stored in a memory or read from a computer readable media such as a CD, hard drive etc. or received from a remote location, e.g. over the Internet. The instructions cause the computer system to begin analyzing each polygon in the hierarchical database.

As shown at a block 104, the computer system analyzes the database starting with the cells at the lowest level of hierarchy. At a block 106, the computer identifies and measures environmental information for each polygon edge in accordance with a set of predefined or user supplied rules that vary with the materials and processes that will be used to make the device in question. The environmental information generally describes everything about the edge that effects its electrical properties including capacitance and resistance. Such information may include, but is not limited to, its length, the distance of an edge to neighboring edges, the area of the conductor associated with the edge, the layer in which the edge is positioned in the circuit, whether an element is partially or fully shielded by another element and other factors known to those skilled in the art of integrated circuit modeling. Measurements for each polygon edge are generally made to every other element with a defined interaction distance either vertically or horizontally within the layout. The particular interaction distance may be user defined or predefined in accordance with the type of device to be created.

In one implementation of the invention, each edge of a polygon is defined as one or more "patterns", wherein a pattern reflects the edge's interaction with other elements in the circuit layout. For example, if an edge has no interaction with any other devices in the layout, the pattern corresponding to the edge would simply indicate the edge's length, area, thickness, etc. If an edge was partially adjacent another edge on the same layer of the circuit, the edge might be broken into two patterns; one that reflects the portion of the edge that interacts with the adjacent edge and one that does not. A single pattern may reflect more than one interaction of a portion of an edge. Taken together, all the patterns associated with an edge define the edge's interactions with its surroundings in the circuit layout.

Figure 5A:
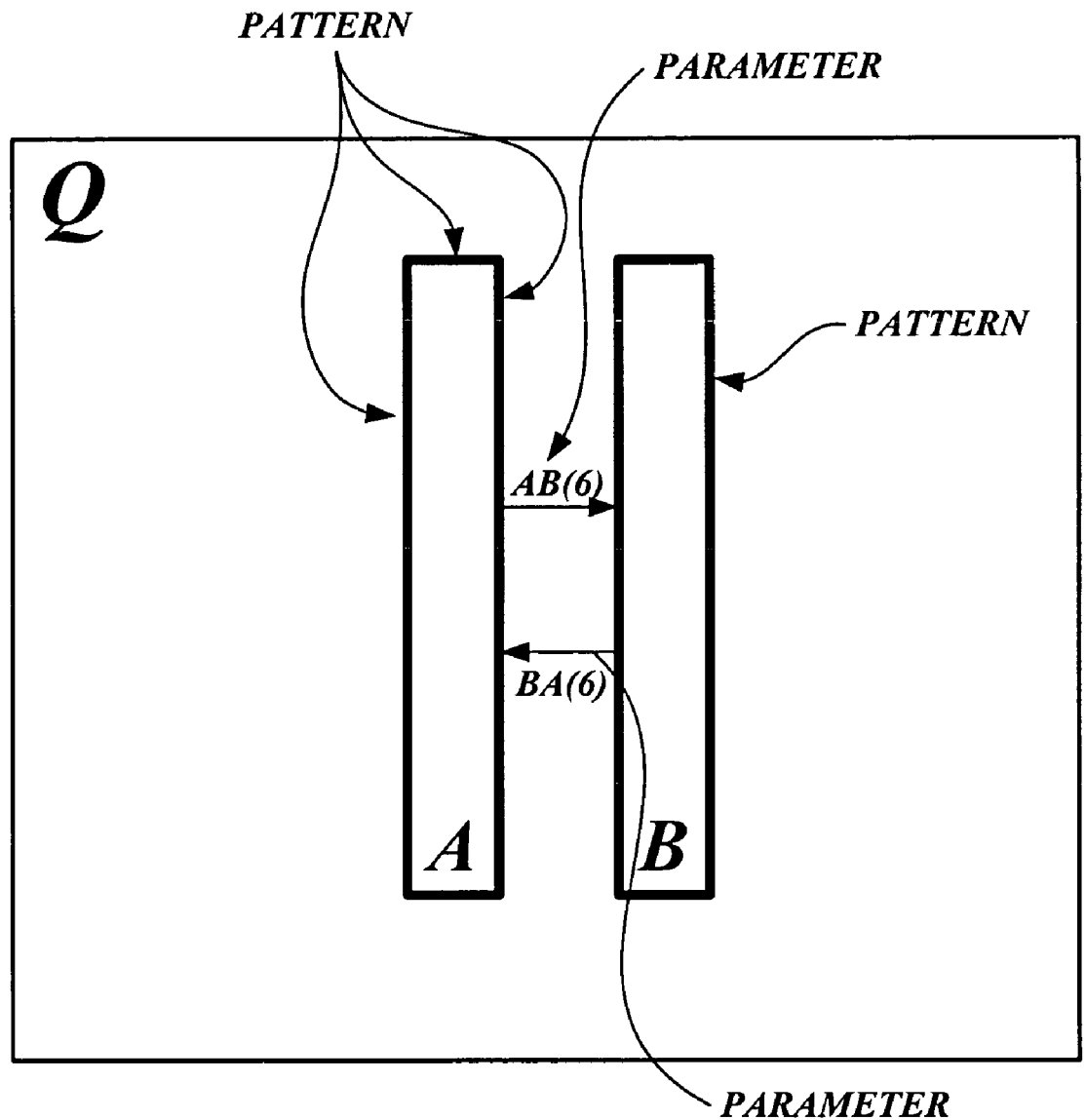
FIGS. 5A-5E graphically illustrate how acts shown in FIGS. 4A-4E extract the resistances and capacitances from the circuit elements defined in a hierarchical database.
Figure 5B:
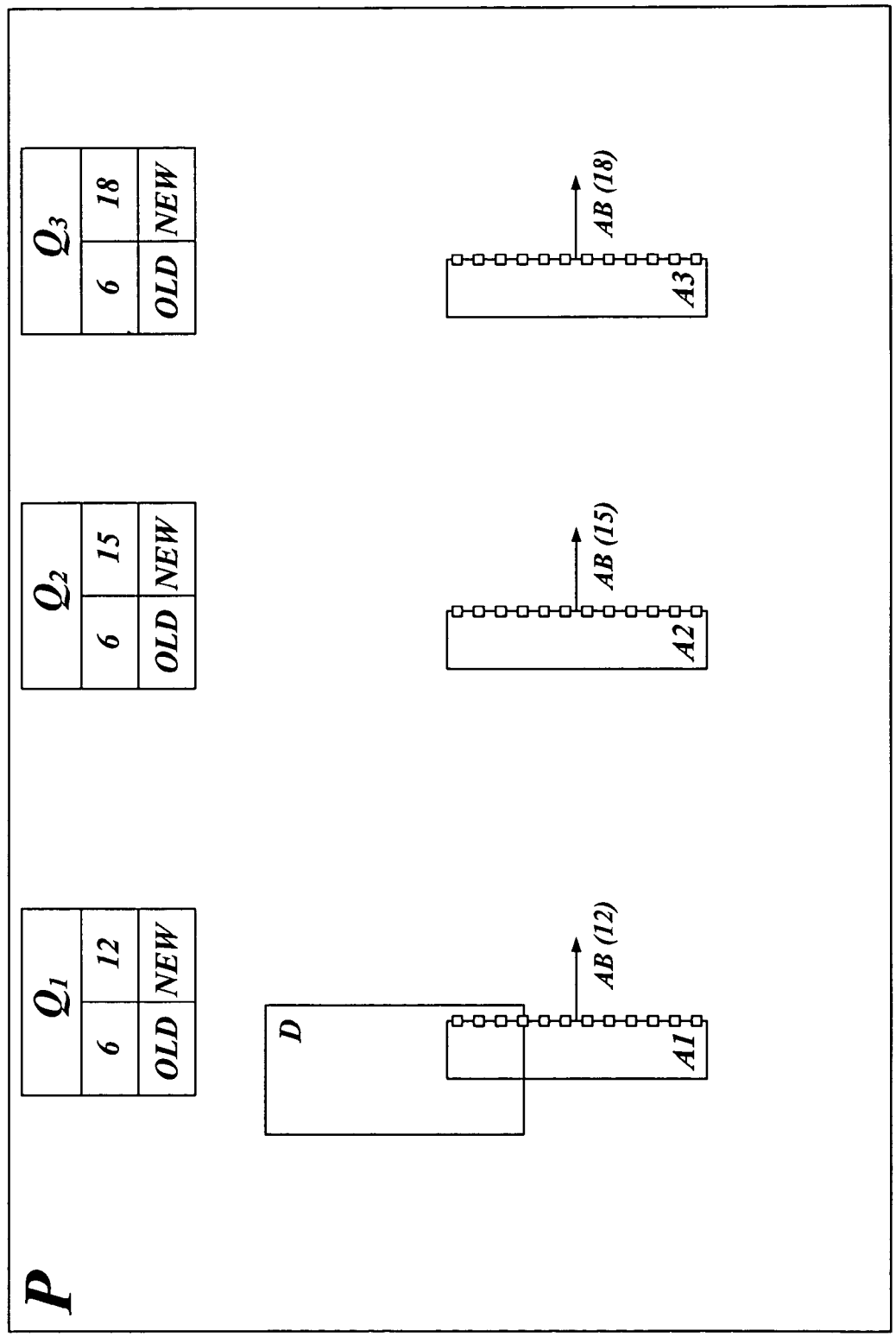

In one implementation of the invention, the environmental measurement information is stored in another hierarchical pattern/parameter database that mimics the hierarchical polygon database as indicated by block 110. The stored environmental measurements are referred to as "parameters." FIG. 5A shows two parameters that are created and assigned to a pair of patterns within a cell. All nearbody parameters are given a unique code that relate it to the pair of patterns and is then stored in the pattern/parameter database at block 108.

In one embodiment of the invention, interactions of an edge with other elements are measured two layers at a time. For example, if a circuit layout has five layers that are represented in the database as the red, orange, yellow, green and blue layers, an edge in the orange layer is measured separately against edges in each of the other four layers (including edges in its own orange layer). Each measurement forms a separate parameter that is associated with a pattern for the edge. By only analyzing two layers at a time unnecessary flattening of the database is avoided.

Once all the intracell measurements have been made for the circuit elements within a cell, the computer system determines if an edge interacts with edges that are defined in one or more of its parent's or sibling's cells. These interactions can generally occur in two ways. First an edge of a polygon may be close enough to the boundary of a cell such that when the cell is placed in the layout, the edges of adjacent cells may interact. Alternatively, a placement of a cell may have a circuit element routed over or under the elements of the cell in another layer that will cause an interaction.

To account for these situations, the hierarchical geometric database is analyzed for any polygon edges within a cell that are within an interaction distance of any geometries defined outside the cell as indicated by block 112. If there are any such polygon edges, copies of the edges are placed in all the parent cells at a block 114 and measured as necessary for parameter generation at a block 120 described below.

At a block 116, the computer system analyzes the hierarchical geometric database for any polygon edges within a cell that overlap any geometries outside the cell. If there are any such polygon edges, copies of the polygon edges are placed in all the parent cells at a block 118 and analyzed as necessary for pattern generation at a block 120.

At a block 120, measurements of the polygon edges are made within the cell as necessary for parameter generation. Overlaps of polygons within a cell are analyzed as necessary for pattern generation. For each geometry layer, patterns and parameters are promoted to the highest level of hierarchy where an overlapping pattern or parameter in that layer occurs.

As shown in FIG. 2, one placement of cell Q has a polygon A that interacts with polygon D. Pattern AB will be generated in cell Q. Pattern AD will be generated in cell P. The overlap of AD with AB causes AB to be promoted into cell P. Because not every placement of cell Q interacts with the polygon D, the individual placements have to be separately identified. Therefore, each placement is given a unique identifier in the database.

In the example shown, the parameter AB(6) that reflects the distance between circuit element A and the circuit element B in level Q of the database is re-identified such as AB(12), AB(15) and AB(18) to reflect the three placements of cell Q.

Only the pattern AD will affect the capacitance calculations for parameter AB(12) because it corresponds to the placement of circuit element A that interacts with the polygon D. Transform tables exist to maintain the correspondence between associated parameters in the pattern/parameter database at different levels of hierarchy.

Once all the promotions have been made, and environmental information evaluated and stored as parameters and patterns, the pattern/parameter database is analyzed to calculate the capacitance and resistance effects to model the electrical behavior of the proposed circuit layout.

Figure 4C:
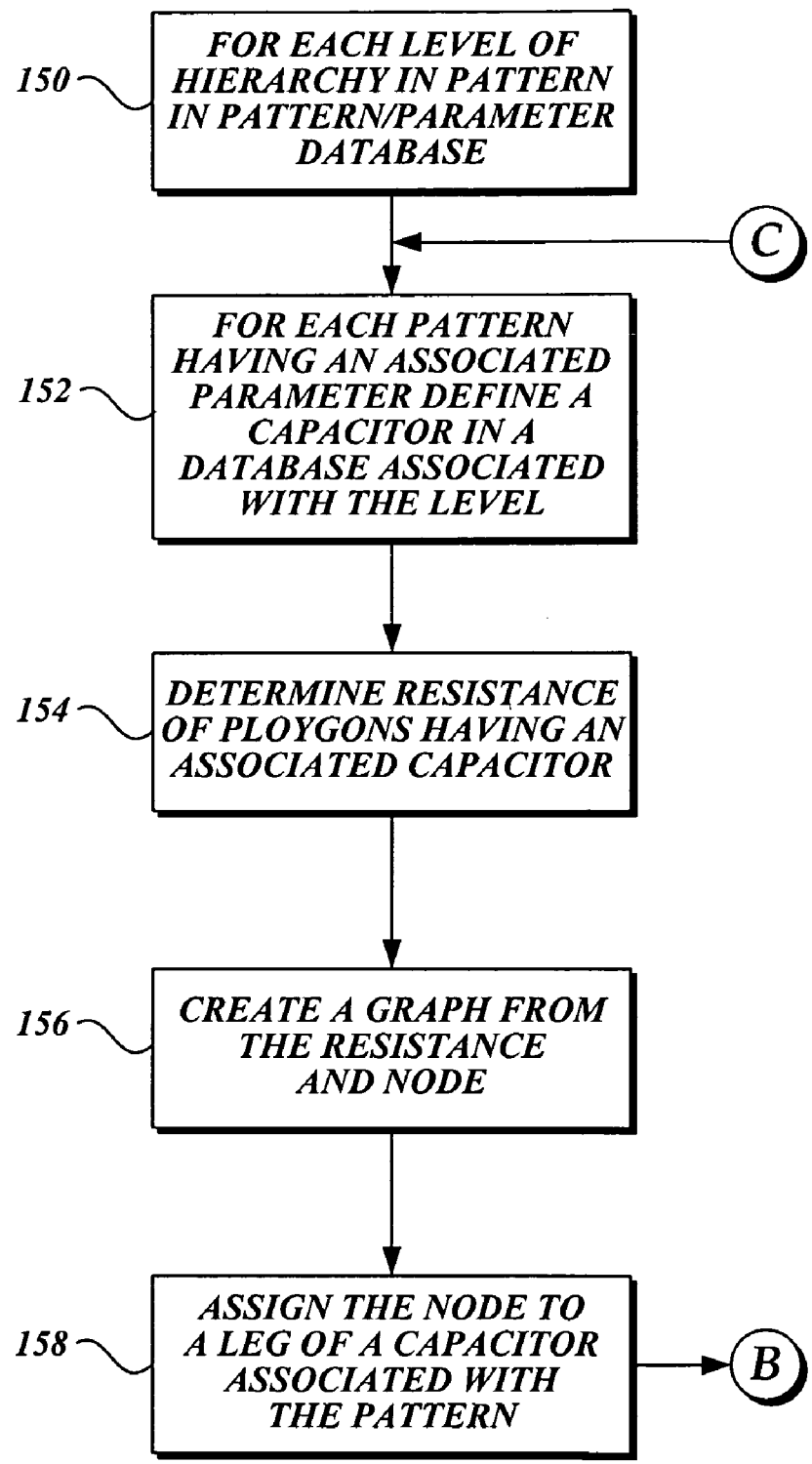
Figure 4D:
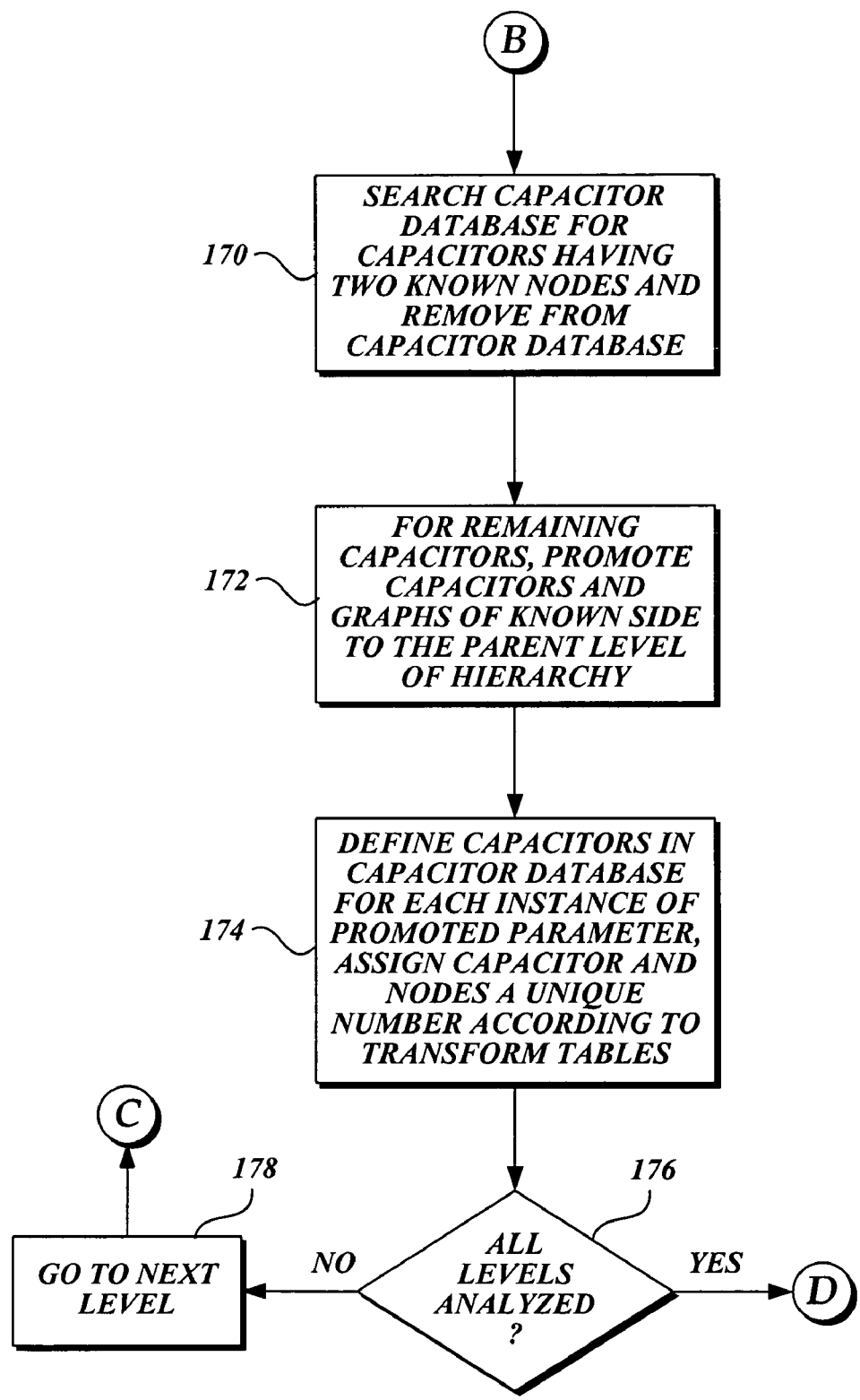

As shown in FIG. 4C, beginning at a block 150, each level of hierarchy in the pattern/parameter database is analyzed preferably starting at the lowest hierarchy level. At a block 152, capacitors are defined for each pattern in the level. If a pattern has parameters associated with it, then all the parameters are given to a capacitance calculating subroutine to compute the appropriate capacitor value. In addition, such capacitance calculations may take into consideration the shielding between elements in the layout. For example, even though three circuit elements may be within an interaction distance of each other, one may partially or fully shield the other such that the proximity of the shielded element does not affect capacitance. Such routines are considered to be known to those of ordinary skill in the integrated circuit modeling art.

Figure 5C:
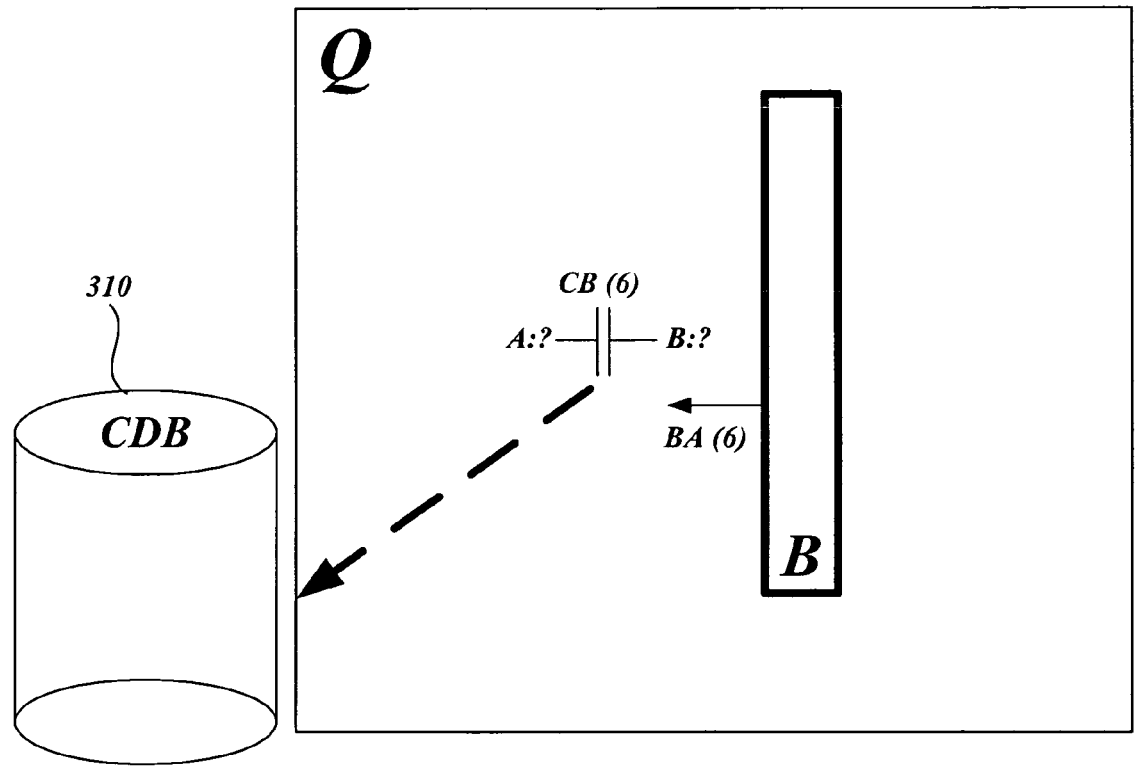

In one implementation of the invention, the capacitor information is stored in a capacitor database associated with the level. However, such information could be stored elsewhere in the computer. FIG. 5C illustrates a capacitor created from the parameter BA(6) in the level Q of the pattern/parameter database. The capacitor is preferably assigned the same identifier as its corresponding parameter. At a block 154, the computer system analyzes the polygon database to determine the resistance of the polygon in the level. In one embodiment of the invention, the Goalie II algorithm is used to determine the resistance of the polygons corresponding to the patterns. However, other known resistance calculation algorithms could also be used. At a block 156, a circuit representation such as graph or subgraph is created from the resistance computed. In general, each polygon will define a graph of n resistors and n+1 nodes.

Figure 5D:
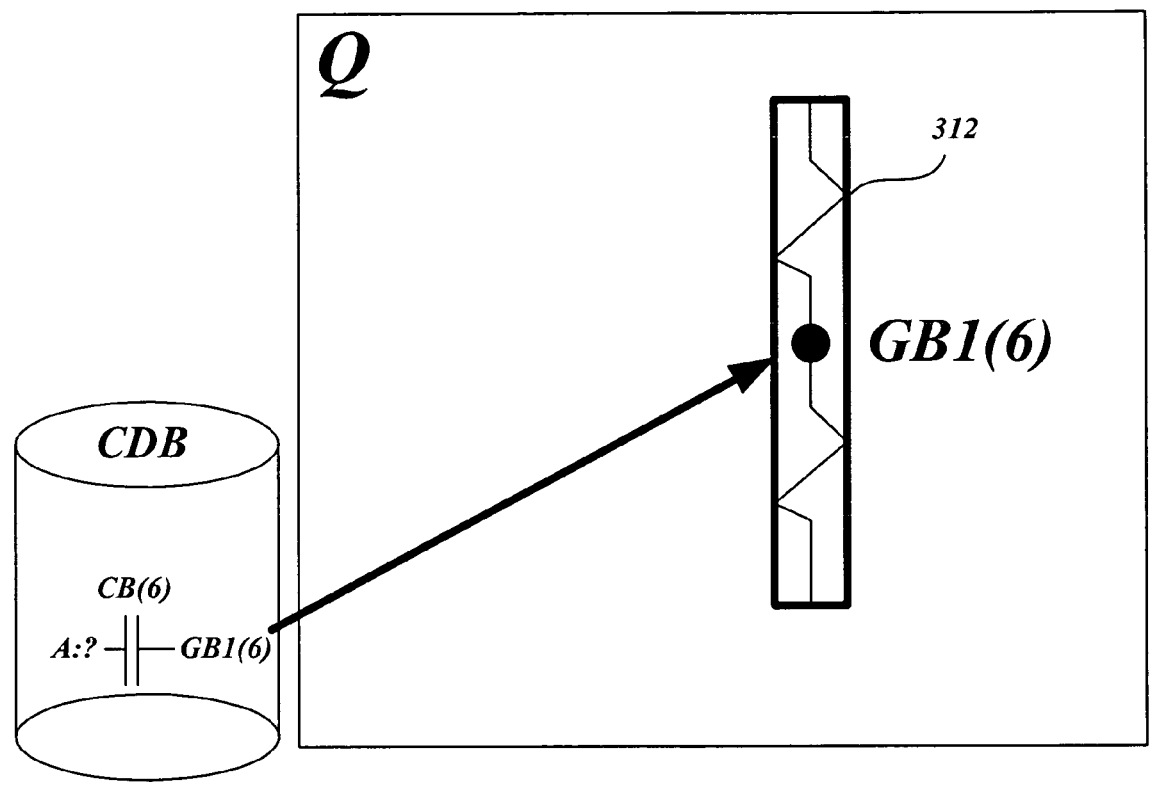

At a block 158, a leg of the capacitor associated with the pattern is assigned to a node of the graph. The graphs created may be defined to have a node for each pattern defined for an edge such that each capacitor can be connected at one end to the node corresponding to its associated pattern. Alternatively, the graph can be created having an arbitrary number of nodes and the capacitors are assigned to a particular node such as the closest node. FIG. 5D illustrates a graph 312 created from polygon B. The graph has a node GB1 in its center and a leg of the capacitor CB(6) node is identified as being connected to the node in the capacitor database.

Figure 5E:
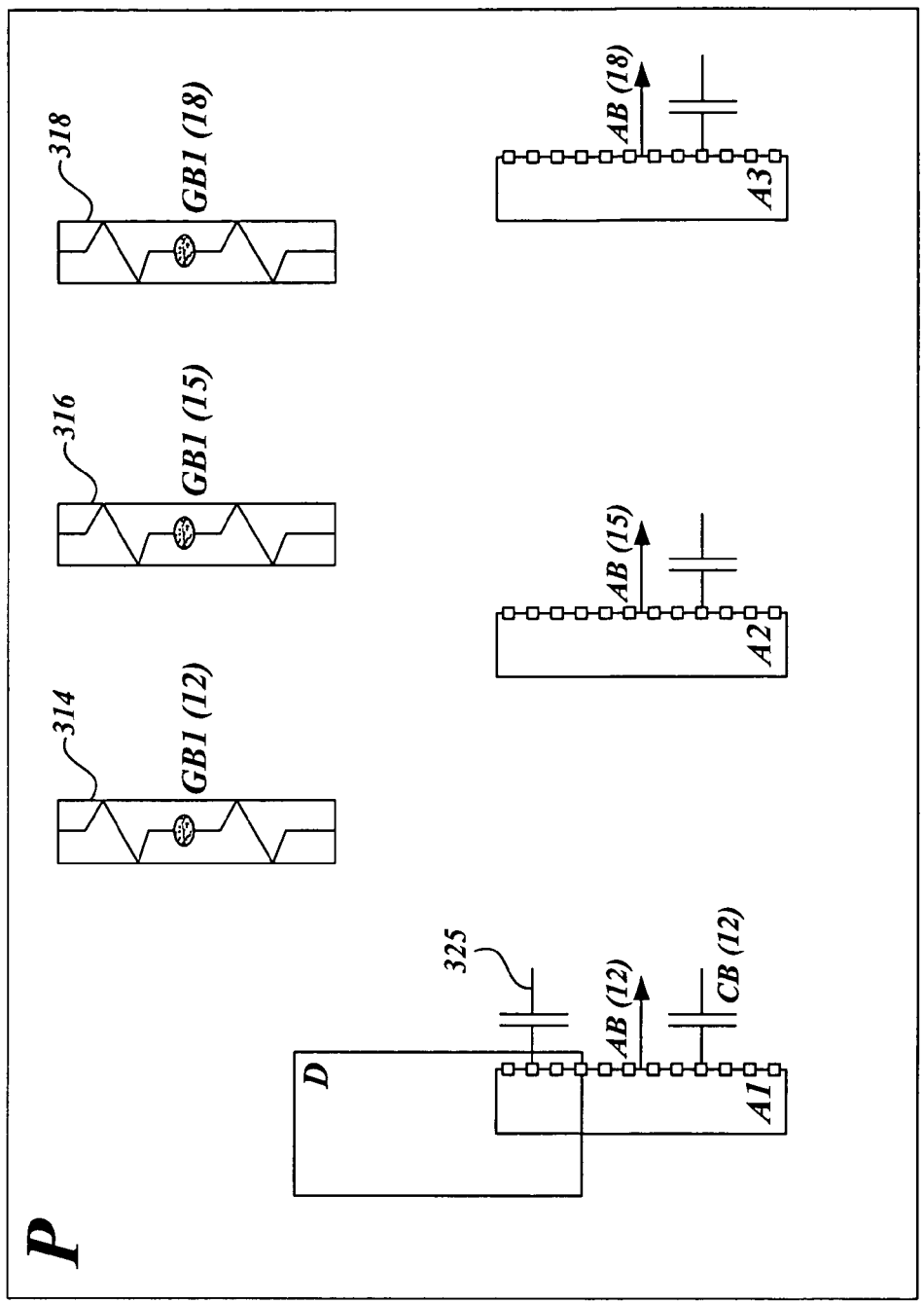

At a block 170, the capacitor database (CDB) associated with the level of the pattern/parameter database is searched for capacitors having two known nodes. If such capacitors are found, they can be removed from the capacitor database. At a block 172, the capacitors and graphs having only one known node are promoted to the levels of hierarchy that reference them in the pattern/parameter database. At a block 174, capacitors are defined in a capacitor database for each instance of the promoted capacitor and graph in addition to the capacitors that are defined for each pattern in the level that has a parameter. The capacitors and nodes are assigned a unique number according to a transform table in the same manner as the promoted patterns and parameters as discussed above. FIG. 5E illustrates three promoted graphs 314, 316, 318 created in level P that are renumbered in accordance with the transform tables of level P. In addition, three new capacitors are created, one for each instance of the promoted capacitor from cell Q. As the capacitors are added to the capacitor database, a check is made to see if there is already a capacitor defined for the pattern. If so, the values of both capacitors are averaged. In the example shown in FIG. 5E, the capacitor database includes a capacitor CB(12) that was promoted from the level associated with cell Q. A new capacitor 325 is defined for cell P that corresponds to the pattern that was promoted to level P. However, because one instance of the promoted pattern interacts with polygon D, the value of capacitor 325 will likely differ from that of capacitor CB(12) so the results are averaged. Those capacitors created for the instances of the promoted pattern that do not interact, i.e. CB(15) and CB(18), will have the same value as the capacitors created lower in the hierarchy, so the average will be the same as the value of the capacitor computed in level Q.

With the capacitor database, a capacitor is stored at the lowest level of hierarchy and can represent many capacitors in the flattened circuit. In addition, where an interaction occurs between a capacitor extracted at a lower level of the hierarchy with a parent, such that the value of the capacitor is affected, the capacitor database accounts for these affects in a hierarchical manner.

Although the capacitors are averaged in one implementation of the invention, it will be appreciated that other techniques such as proportional weighting, statistical weighting or other techniques could be used to adjust the value of the capacitors created from edges that interact with polygons on other levels.

As will be appreciated, the effect of computing the electrical interactions between two circuit elements in either direction and averaging or otherwise combining the results for edges (patterns) that interact with elements in another cell of the hierarchy is to break a cycle that requires that every circuit element be promoted to its topmost level of hierarchy before an electrical interaction can be computed.

In the example shown, it is possible to compute a near body capacitance between circuit elements A and B in level Q of the database without having to promote every instance of element B into level P just because one instance of element A happens to interact with a circuit element in another level. Therefore all the measurement operations completed in level Q of the database can be performed one time and reused.

Returning to FIG. 4D at a block 176, it is determined whether all levels in the pattern/parameter database have been analyzed. If not, processing proceeds to block 178 and the next level in the pattern/parameter database is analyzed by returning to block 152 as shown in FIG. 4C. Once all levels in the pattern/parameter database have been analyzed, processing proceeds to the series of acts shown in FIG. 4E to add the intrinsic plate capacitances.

Beginning at a block 200, the lowest level of hierarchy in the pattern/parameter database is analyzed. At a block 202, for each pattern, the area of overlap with the substrate is determined. At a block 204, a capacitor is defined with one leg attached to a node of the graph associated with the pattern and another leg attached to the substrate. For each side of the polygon, a fringe capacitor is defined and connected to a substrate or intervening pattern.

At a block 208, it is determined if all patterns in the level have been analyzed. If not, processing returns to block 202. Once all patterns in the level have been analyzed, processing proceeds to a block 210 wherein it is determined if all levels in the pattern/parameter database have been analyzed. If not, processing analyzes the next level at a step 212 by returning to the steps indicated at block 202.

Figure 4E:
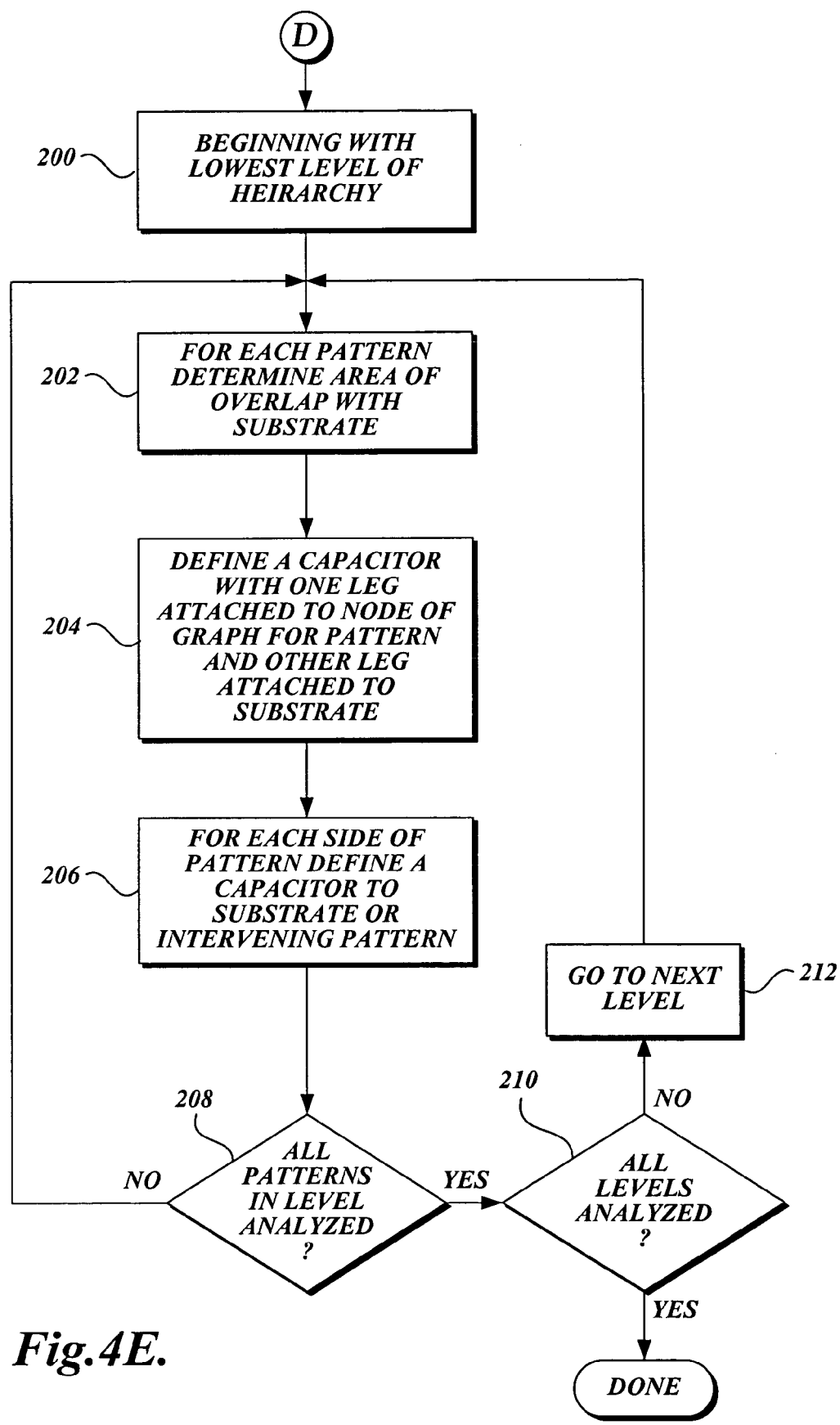

Once the acts in FIG. 4E have been completed, the intrinsic, cross over and near body capacitances have been accounted for and arranged into circuit representations such as graphs within the computer. The computer then flattens the database by using the graphs from each cell to build a network that can be analyzed by a circuit analysis program such as Mentor Graphics' MACH/TA™. By computing graphs for repeated patterns of elements, such graphs can be re-used at each placement of the repeated cell without having to re-extract parasitic electrical information.

In the example shown in FIGS. 5A-5E, the capacitance between circuit elements A and B is computed in two ways. The capacitance from B to A is computed taking element B's environmental information only. The capacitance from A to B is calculated taking into consideration element A's environmental information as measured in cell Q plus element A's environmental information due to its last interaction with circuit elements in a parent cell. The results of the two-capacitor calculations are then combined by averaging or the like.

In another implementation of the invention, the environmental information for a first circuit element that interacts with a second circuit element is also promoted to a higher hierarchy level. It is relatively easy to promote the environmental information if its measurement is made in a lower level so that the measurements do not need to be repeated for each placement of a cell. With the environmental information from both sides of a capacitor at the higher level of the hierarchy, a more accurate estimate of the capacitor value may be made.

Figure 6:
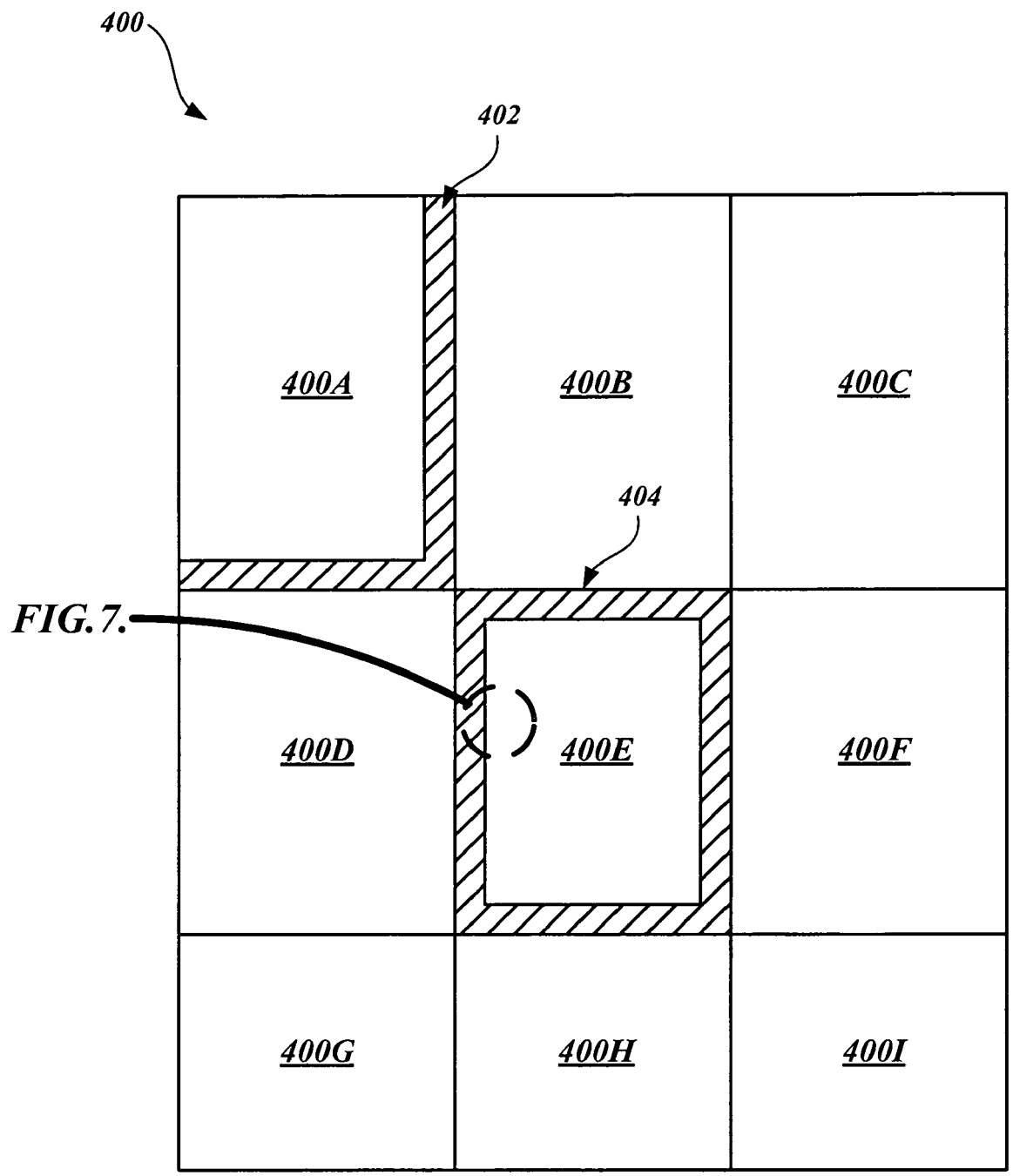
FIGS. 6 and 7 graphically illustrate another implementation of a resistance and capacitance extraction method in accordance with the present invention.

In some instances it may be advantageous to flatten a portion of a layout to compute capacitances and resistances. FIG. 6 illustrates an integrated circuit layout 400 that is defined by a database describing each circuit element to be created. In this embodiment, the layout is divided into two or more tiles 400A-400I that describe a portion of the layout. Each tile can be processed sequentially by the same computer or the layout can be divided into a number of subfiles that are given to separate computers for parallel processing. Tiles are typically uniform rectanguls, but can be other shapes such as squares or trapezoids and can be either adjacent or overlapping. They can also be particular shapes derived from the original hierarchy.

In this implementation of the invention a boundary region or area 402, 404 etc. is defined around the perimeter of each tile that abuts an adjacent tile. Those elements inside of the boundary region are positioned far enough away from the circuit elements in an adjacent tile so that no interaction occurs. The circuit elements within a boundary region itself may interact with circuit elements in the inner portion of a tile or with circuit elements in an adjacent tile's boundary region. The size of the boundary region need not be uniform across layers of the integrated circuit.

Figure 7:
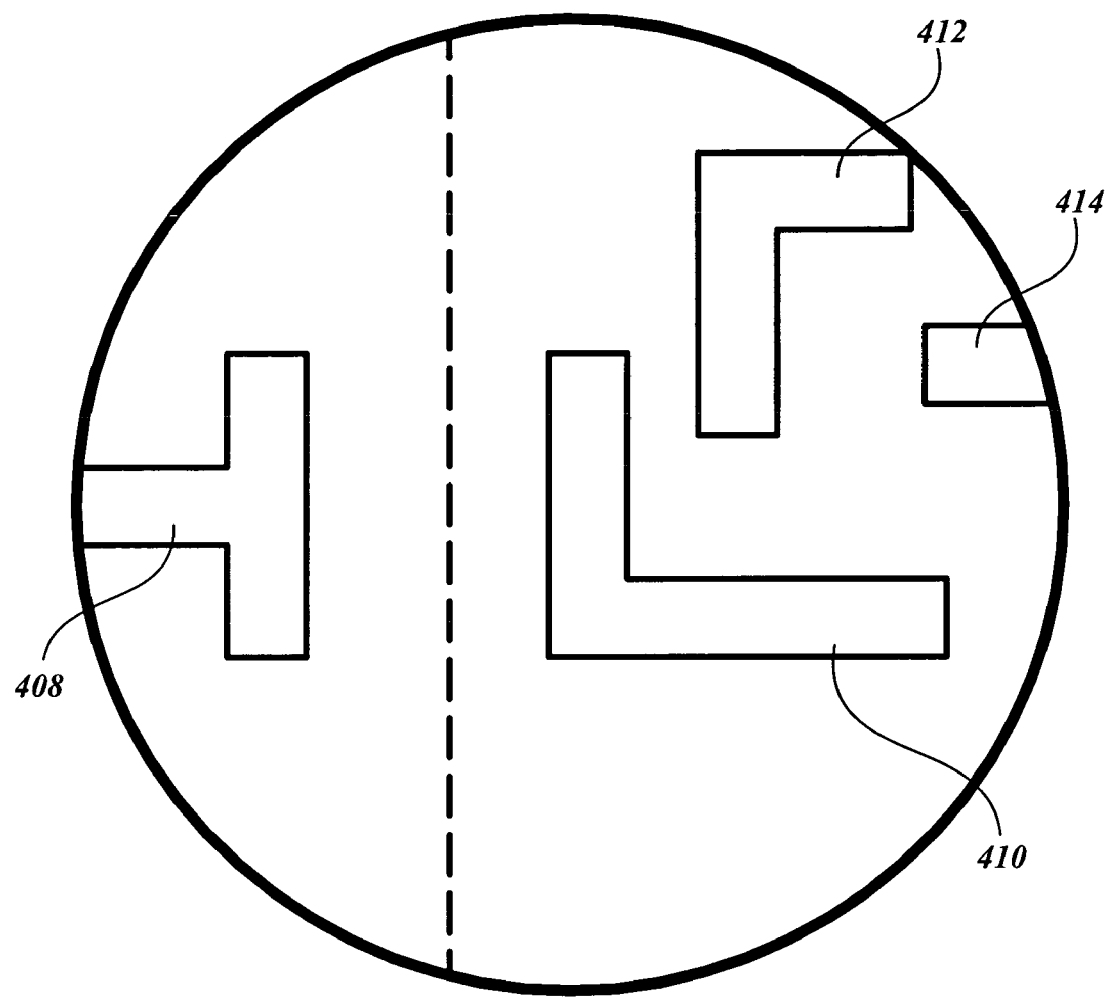

FIG. 7 illustrates a portion of a boundary region having a circuit element 408 that is within the boundary region and circuit elements 410, 412, 414 that are inside of the boundary area of the tile 400E.

By creating the boundaries, the cascading effect of the need to analyze the entire layout database can be broken. For example, if the capacitance between circuit element 408 and a circuit element in an adjacent boundary region is to be calculated then typically the proximity of element 408 to element 410 must be considered. However circuit element 410 is also affected by element 412, which in turn is affected by element 414 etc. To avoid having to analyze all these elements together, the capacitance from element 410 to element 408 is estimated without regard to element 408's interaction with neighboring elements. The capacitance from element 408 to element 410 is also estimated without regard to the interaction of element 410 with its neighboring elements. The results of the capacitance calculations can then be averaged, or otherwise combined.

Figure 8:
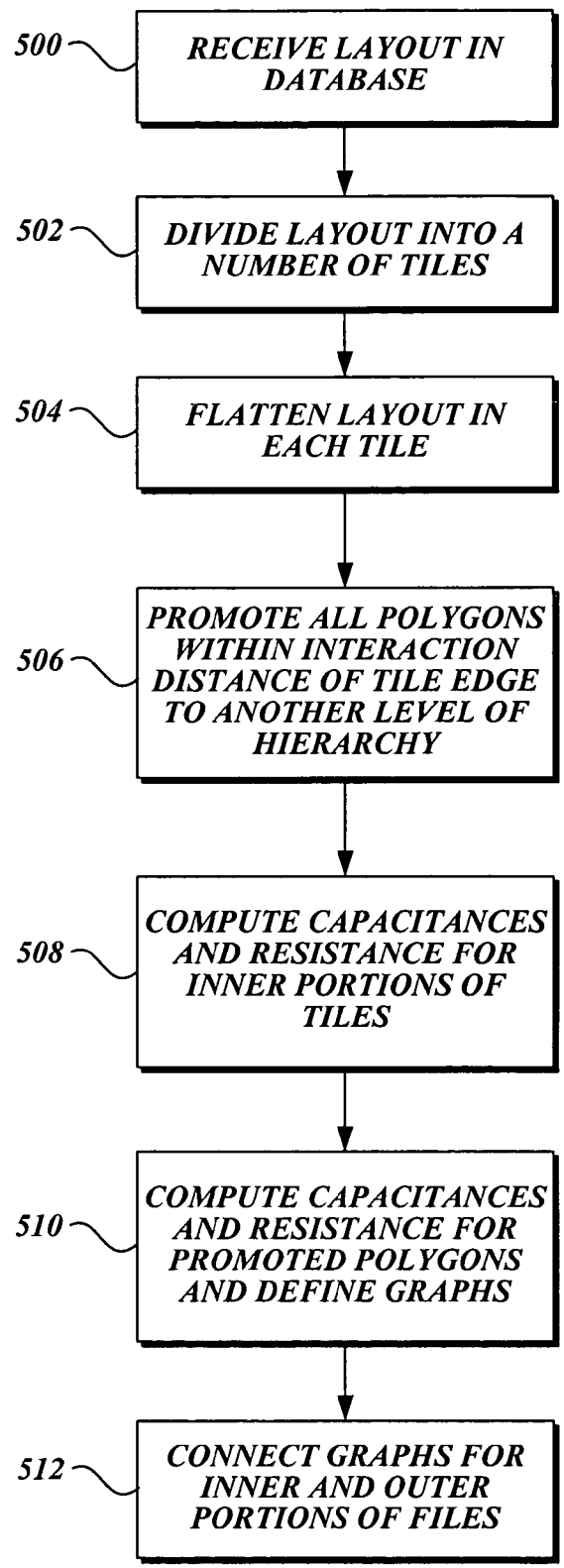
FIG. 8 is a flowchart illustrating a series of acts performed to extract resistance and capacitance information as shown in FIGS. 6 and 7.

FIG. 8 illustrates a series of acts to implement the calculation of the resistances and capacitances of the circuit elements in a tiled layout. Beginning at a block 500, a database of a device to be created is received. At a block 502, the layout is divided into two or more adjacent tiles over the area of the device to be created.

At a block 504, the elements in the database for each tile region are flattened, if not done so already. That is, the database is written to include descriptions of each element at each location within the tiled area. At a block 506, all polygons that may interact with polygons in an adjacent tile are promoted to another level of the database. Prior to promotion, however, it is generally necessary to measure the interaction of elements within the boundary region and those elements inside the boundary region. The promotion creates an additional level of hierarchy in the database and ensures that the remaining elements in a tile will not interact with elements in another tile. At a block 508, the capacitances and resistances are computed for each of the elements inside the boundary region of a tile. For those elements that interact with an element in a boundary region, an estimate of the capacitance is made as described above. At a block 510, the capacitances and resistances are computed for the elements within the boundary regions. For circuit elements in a boundary region that interact with elements in the center of a tile, an estimate of the capacitance is made. The estimates of the capacitances are averaged or otherwise combined to define a single capacitance for the graphs associated with the elements in and out of the boundary region. At a block 512, graphs associated with polygons in the tiles and those associated with the promoted polygons are connected to form a network that is analyzed by a circuit analysis program to verify the layout design.

While the preferred embodiment of the invention has been illustrated and described, it will be appreciated that various changes can be made therein without departing from the scope of the invention. For example, the present invention is not limited to computing capacitances between neighboring circuit elements. The techniques described may also be used to compute the inductance between elements. Thus the invention is useful in analyzing all electrical interactions between circuit elements in a layout. Furthermore, the present invention also allows an extraction program or tool to be integrated with a software package that uses a common hierarchical database such as the Calibre® verification software from Mentor Graphics. Because the hierarchical database is the same for each tool (i.e. DRC, LVS, OPC etc.) significant processing time can be saved as opposed to having to export a database in an optimized format for the extraction tool. Therefore the scope of the invention is to be determined from the following claims and equivalents thereto.

The embodiments of the invention on which an exclusive property or privilege is claimed are defined as follows:

1. A method of computing electrical parameters of elements to be created in an integrated circuit, comprising:

creating a database that defines elements to be created in a layout of the integrated circuit, the database defining a number of cells that define circuit elements that may be repeated in the layout;

computing the electrical parameters for each element in a cell to form a circuit representation, and using the circuit representations computed for each circuit element at each placement of the corresponding cells; and rearranging the circuit representations for all cells in the database into a format suitable for circuit analysis, wherein a circuit representation of a cell is adjusted for the interaction of a circuit element in the cell with a circuit element in another cell, and wherein the circuit representation is adjusted by promoting the element of the cell into the cell having the interacting element and computing the electrical parameters of the promoted element while adjusting for the interaction, or by creating a copy of the interacting elements of the other cell within the cell in which the electrical parameters are being computed.

2. The method of claim 1, wherein the format suitable for circuit analysis is a netlist.

3. The method of claim 1, wherein the circuit representations are graphs.

4. The method of claim 1, wherein the electrical parameters include resistances.

5. The method of claim 1, wherein the electrical parameters include capacitances.

6. The method of claim 1, wherein the electrical parameters include inductances.

7. A method of extracting electrical behavior information from an integrated circuit layout comprising:

creating a hierarchical layout database that defines circuit elements to be created in the integrated circuit, the database grouping circuit elements into cells that may be repeated in the layout;

for each circuit element in a cell, computing environmental information that affects its electrical behavior with neighboring circuit elements;

determining if a circuit element interacts with a circuit element defined in a higher level of hierarchy in the database;

combining the elements that are interacting in the same level of hierarchy; and estimating the electrical behavior of a circuit element from the environmental information within a cell including any environmental information determined at a lower level of hierarchy.

8. The method of claim 7, wherein the electrical behavior is a capacitance.

9. The method of claim 7, wherein the electrical behavior is an inductance.

10. The method of claim 7, wherein the elements are combined by promoting an element from a lower level of hierarchy to a higher level of hierarchy.

11. The method of claim 7, wherein the elements are combined by copying an element from a lower level of hierarchy to a higher level of hierarchy.

12. The method of claim 7, wherein the elements are combined by copying the elements from the higher level of hierarchy into the lower level of hierarchy.

13. A method of determining an electrical interaction between two circuit elements in an integrated circuit layout, comprising:

creating a database that defines the circuit elements to be created in the integrated circuit on different levels, each level defining a portion of the circuit elements to be created;

measuring environment parameters surrounding a first circuit element that affect its electrical interaction with a second circuit element;

estimating a first electrical interaction between the first and second circuit elements based on the environment parameters of the first circuit element;

measuring environment parameters surrounding the second circuit element that affect its electrical interaction with the first circuit element;

estimating a second electrical interaction between the second circuit element and the first circuit element based on the environment parameters; and calculating the electrical interaction between the first and second circuit elements using the first and second estimates.

14. The method of claim 13, wherein the first and second estimates are averaged to calculate the electrical interaction.

15. The method of claim 13, wherein the first and second estimates are proportionally weighted to calculate the electrical interaction.

16. The method of claim 13, further comprising promoting the environment parameters measured for the first circuit element to another database level such that estimates of the electrical interaction between the first and second circuit elements utilize the environment parameters from the first and second circuit elements.

17. The method of claim 13, wherein the electrical interaction is a capacitance.

18. The method of claim 13, wherein the electrical interaction is an inductance.

19. A computer readable media on which is stored a sequence of program instructions for execution by a computer, the instructions causing the computer to perform a method of extracting electrical behavior information from an integrated circuit layout comprising:

creating a hierarchical layout database that defines circuit elements to be created in the integrated circuit, the database grouping circuit elements into cells that may be repeated in the layout;

for each circuit element in a cell, computing environmental information that affects its electrical behavior with neighboring circuit elements;

determining if a circuit element interacts with a circuit element defined in a higher level of hierarchy in the database;

combining the elements that are interacting in the same level of hierarchy; and estimating the electrical behavior of a circuit element from the environmental information within a cell including any environmental information computed in a lower level of hierarchy.

20. The computer readable media of claim 19, wherein the instructions cause the computer to estimate capacitance as the electrical behavior.

21. The computer readable media of claim 19, wherein the instructions cause the computer to estimate inductance as the electrical behavior.

22. The computer readable media of claim 19, wherein the instructions cause the computer to combine elements by promoting an element from a lower level of hierarchy to a higher level of hierarchy.

23. The computer readable media of claim 19, wherein the instructions cause the computer to combine elements by copying an element from a lower level of hierarchy to a higher level of hierarchy.

24. The computer readable media of claim 19, wherein the instructions cause the computer to combine elements by copying an element from a higher level of hierarchy to a lower level of hierarchy.

25. A computer readable media on which is stored a sequence of program instructions for execution by a computer, the instructions causing the computer to perform a method of determining an electrical interaction between two circuit elements in an integrated circuit layout, comprising:

creating a database that defines the circuit elements to be created in the integrated circuit on different levels, each level defining a portion of the circuit elements to be created;

measuring environment parameters surrounding a first circuit element that affect its electrical interaction with a second circuit element;

estimating a first electrical interaction between the first and second circuit elements based on the environment parameters of the first circuit element;

measuring environment parameters surrounding the second circuit element that affect its electrical interaction with the first circuit element and promoting the environment parameters to another level of the database defining circuit elements that affect the electrical interaction of the second circuit element, measuring the environment parameters surrounding the second circuit element in the other level of the database;

estimating a second electrical interaction between the second circuit element and the first circuit element based on the environment parameters and the promoted environment parameters; and calculating the electrical interaction between the first and second circuit elements using the first and second estimates.

26. A computer readable media on which is stored a sequence of program instructions for execution by a computer, the instructions causing the computer to perform a method of computing electrical parameters of elements to be created in an integrated circuit, the method comprising:

creating a database that defines elements to be created in a layout of the integrated circuit, the database defining a number of cells that define circuit elements that may be repeated in the layout;

computing the electrical parameters for each element in a cell to form a circuit representation, and using the circuit representations computed for each circuit element at each placement of the corresponding cells; and rearranging the circuit representations for all cells in the database into a format suitable for circuit analysis, wherein a circuit representation of a cell is adjusted for the interaction of a circuit element in the cell with a circuit element in another cell, and wherein the circuit representation is adjusted by promoting the element of the cell into the other cell having the interacting element and computing the electrical parameters of the promoted element while adjusting for the interaction, or by creating a copy of the interacting elements of the other cell within the cell in which the electrical parameters are being computed.

27. The computer readable media of claim 26, wherein the format suitable for circuit analysis is a netlist.

28. The computer readable media of claim 26, wherein the circuit representations are graphs.

29. The computer readable media of claim 26, wherein the electrical parameters include resistances, capacitances, or inductances.

30. A computer readable media on which is stored a sequence of program instructions for execution by a computer, the instructions causing the computer to perform a method of determining an electrical interaction between two circuit elements in an integrated circuit layout, comprising:

creating a database that defines the circuit elements to be created in the integrated circuit on different levels, each level defining a portion of the circuit elements to be created;

measuring environment parameters surrounding a first circuit element that affect its electrical interaction with a second circuit element;

estimating a first electrical interaction between the first and second circuit elements based on the environment parameters of the first circuit element;

measuring environment parameters surrounding the second circuit element that affect its electrical interaction with the first circuit element;

estimating a second electrical interaction between the second circuit element and the first circuit element based on the environment parameters; and calculating the electrical interaction between the first and second circuit elements using the first and second estimates.

31. The computer readable media of claim 30, wherein the first and second estimates are averaged or proportionally weighted to calculate the electrical interaction.

32. The computer readable media of claim 30, further comprising promoting the environment parameters measured for the first circuit element to another database level such that estimates of the electrical interaction between the first and second circuit elements utilize the environment parameters from the first and second circuit elements.

33. The computer readable media of claim 30, wherein the electrical interaction is a capacitance or an inductance.

* * * * *